United States Patent
Park et al.

(10) Patent No.: US 7,939,245 B2
(45) Date of Patent: May 10, 2011

(54) LIGHT ABSORBENT AND ORGANIC ANTIREFLECTION COATING COMPOSITION CONTAINING THE SAME

(75) Inventors: Joo-Hyeon Park, Chungcheongnam-do (KR); Ji-Young Kim, Seoul (KR); Jun-Ho Lee, Chungcheongnam-do (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 90 days.

(21) Appl. No.: 12/157,819

(22) Filed: Jun. 13, 2008

(65) Prior Publication Data

US 2009/0258321 A1   Oct. 15, 2009

(30) Foreign Application Priority Data

Apr. 11, 2008 (KR) .................. 10-2008-0033712

(51) Int. Cl.
G03F 7/11 (2006.01)
C08F 2/44 (2006.01)
C09K 3/00 (2006.01)
H01L 21/30 (2006.01)

(52) U.S. Cl. ......... 430/271.1; 525/107; 560/73; 560/85; 560/52; 560/11; 560/18; 430/311

(58) Field of Classification Search ................ None
See application file for complete search history.

(56) References Cited

U.S. PATENT DOCUMENTS

| | | | |
|---|---|---|---|
| 5,695,910 A * | 12/1997 | Urano et al. ............ | 430/270.1 |
| 2004/0027625 A1 * | 2/2004 | Trentler et al. .......... | 359/3 |
| 2004/0112289 A1 * | 6/2004 | Moriya et al. ........... | 118/715 |
| 2004/0121260 A1 * | 6/2004 | Nakamura et al. ....... | 430/270.1 |
| 2006/0057501 A1 * | 3/2006 | Wu et al. ................ | 430/311 |
| 2008/0286689 A1 * | 11/2008 | Zhuang et al. .......... | 430/285.1 |
| 2010/0055408 A1 * | 3/2010 | Lee et al. ............... | 428/172 |

OTHER PUBLICATIONS

Narimatsu et al , Chemical Physics Letters, vol. 429, 2006, pp. 488-491, avaiable on line from www.sciencedirect.com and www.elsevier.com/locate/eplett, available on line Aug. 9, 2006. copyrignt Elsevier B.V.*
Browning et al, J. Membrane Biol. vol. 49, pp. 75-103, year 1979, no month given.*

* cited by examiner

Primary Examiner — Cynthia Hamilton
(74) Attorney, Agent, or Firm — Davidson, Davidson & Kappel, LLC

(57) ABSTRACT

The present invention relates to a light absorbent for organic anti-reflection coating formation, and an organic anti-reflection film composition containing the same. The light absorbent for organic anti-reflection film formation according to the present invention is a compound of the following formula (1a), a compound of the following formula (1b), a mixture of compounds of the formulas (1a) and (1b):

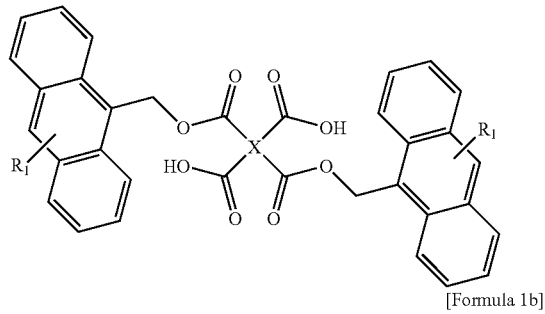

[Formula 1a]

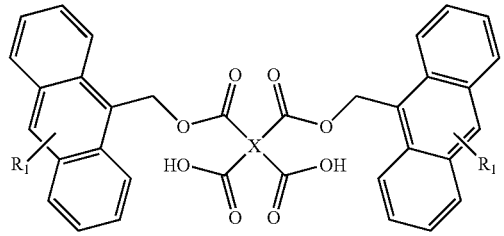

[Formula 1b]

wherein X is selected from the group consisting of a substituted or unsubstituted cyclic group having 1 to 20 carbon atoms, aryl, diaryl ether, diaryl sulfide, diaryl sulfoxide and diaryl ketone; and $R_1$ is a hydrogen atom, a substituted or unsubstituted alkyl group having 1 to 10 carbon atoms, or an aryl group having 1 to 14 carbon atoms.

9 Claims, 3 Drawing Sheets

LIGHT ABSORBENT AND ORGANIC ANTIREFLECTION COATING COMPOSITION CONTAINING THE SAME

This application claims priority to Korean Patent Application No. 10-2008-0033712, filed Apr. 11, 2008 and hereby incorporated by reference herein.

BACKGROUND OF THE INVENTION

1. Field of the Invention

The present invention relates to an organic anti-reflection coating composition for preventing reflection at the undercoat layer and preventing standing wave during a lithography process, and having a high dry etching rate, and a novel light absorbent included in the composition. More particularly, the invention relates to a novel light absorbent which can be used in the production of an organic anti-reflection coating that is useful for semiconductor ultrafine patterning using a KrF excimer laser, and an organic anti-reflection coating composition containing the same.

The present invention also relates to a method for patterning a semiconductor device using the organic anti-reflection coating composition.

2. Description of the Related Art

The recent high integration of semiconductor devices has led to a demand for ultrafine patterns with a line width of 0.10 micrometers or less in the production of ultra-LSI and the like, and a lithography process using light having a smaller wavelength than the conventionally used light for exposure having a wavelength in the region of g-ray or i-ray, is also demanded. Thus, microlithography processes using KrF excimer laser or ArF excimer laser are currently used in the processes for producing semiconductor devices.

As the size of the pattern of semiconductor devices is ever decreasing, only when the reflection rate is maintained to be less than 1% at maximum during the progress of the exposure process, uniform pattern can be obtained, an adequate process margin can be obtained, and a desired yield can be achieved.

Therefore, a technology of disposing underneath a photoresist, an organic anti-reflection coating containing organic molecules which are capable of absorbing light, in order to reduce the reflection rate as far as possible, and thereby regulating the reflection rate to prevent reflection at the undercoat layer and to remove standing wave, has become important.

Accordingly, the organic anti-reflection coating composition should satisfy the following requirements.

First, the organic anti-reflection coating composition should contain a material which is capable of absorbing light in the region of the wavelength of the exposure light source, in order to prevent reflection at the undercoat layer.

Secondly, the anti-reflection coating should not be solubilized and destroyed by the solvent of a photoresist during the process of laminating the anti-reflection coating and then laminating a photoresist. For this, the anti-reflection coating must be designed to have a thermally curable structure, and curing should be accelerated by carrying out a baking process after coating in the process for laminating anti-reflection coating.

Thirdly, the anti-reflection coating should be able to be etched faster than the photoresist in the upper part, so as to reduce a loss of the photoresist resulting from etching of the undercoat layer.

Fourthly, the anti-reflection coating composition should not be reactive to the photoresist in the upper part. Also, compounds such as amine or acid should migrate to the photoresist layer, because these compounds may cause deformation in the photoresist pattern, such as footing or undercoat in particular.

Fifthly, the anti-reflection coating composition should have optical properties that are appropriate for various exposure processes in accordance with various substrates, that is, an appropriate refractive index and an absorption coefficient, and also should have good adhesiveness to the substrate and the photoresist.

SUMMARY OF THE INVENTION

To overcome such problems as described above, according to an aspect of the present invention, there is provided a novel light absorbent which can be used as an organic anti-reflection coating capable of absorbing a reflected light generated upon exposure during an ultrafine patterning lithography process using a KrF excimer laser having a wavelength of 248 nm, and an organic anti-reflection coating composition containing the materials.

According to another aspect of the invention, in order to design the fundamental structure of the anti-reflection coating to be a chemical structure capable of accelerating the etching rate of the organic anti-reflection coating, to produce a polymer based on the structure, there is provided a method for producing an organic anti-reflection coating based on the polymer, thereby facilitating the etching process. Also, according to another aspect of the invention, there is provided a method for patterning a semiconductor device using the organic anti-reflection coating composition, which method is capable of eliminating undercut, footing or the like, and achieving excellent ultrafine patterning.

DESCRIPTION OF THE PREFERRED EMBODIMENTS

Figure 1:
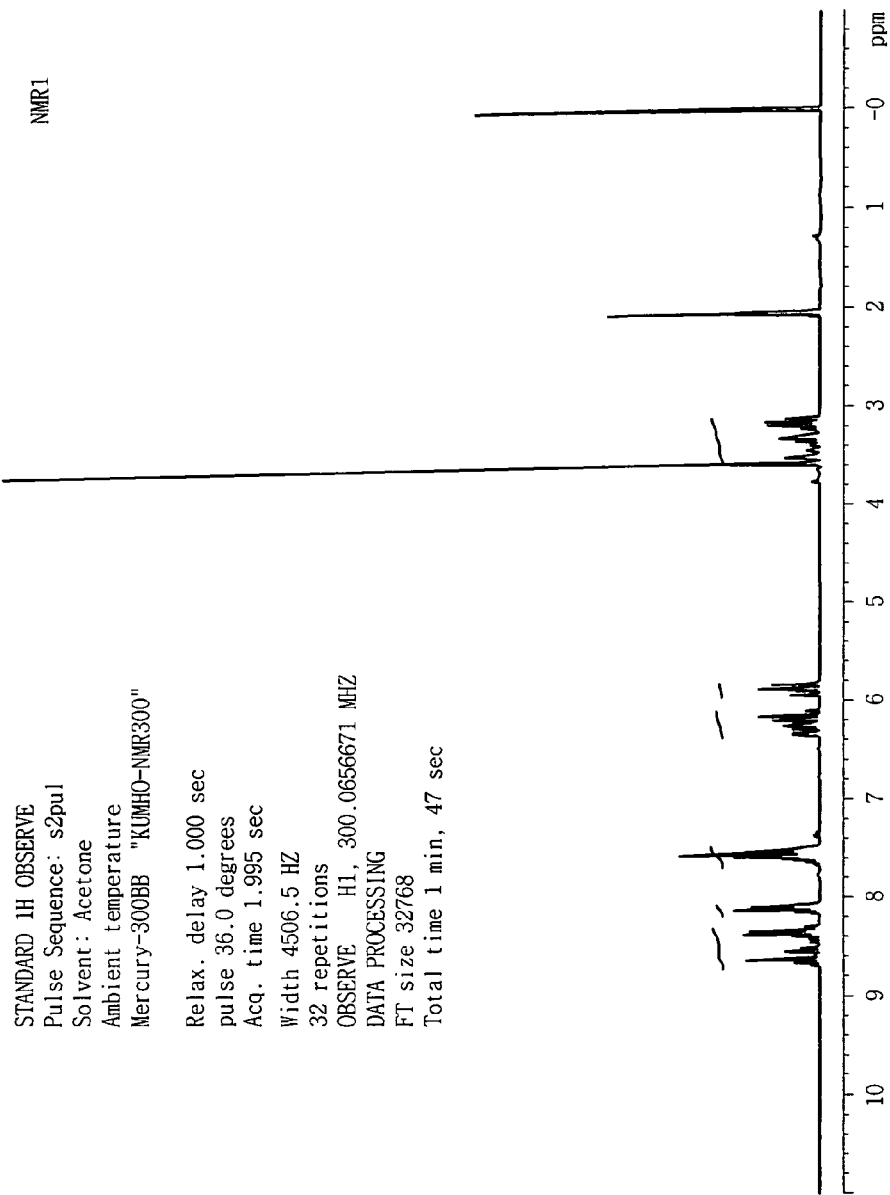
FIG. 1 is a $^1$H-NMR spectrum of the copolymer produced according to Synthesis Example 1.

The light absorbent for organic anti-reflection coating formation according to the present invention is a compound of the following formula (1a), a compound of the following formula (1b), a mixture of compounds of the formulas (1a) and (1b), or a compound of the following formula (2):

[Formula 1a]

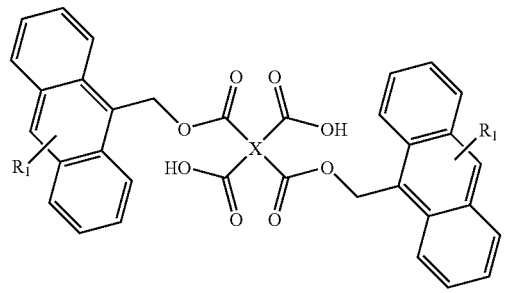

[Formula 1b]

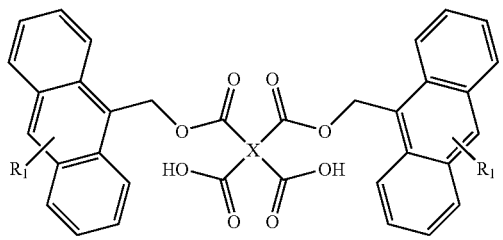

wherein in the formulas (1a) and (1b), X is selected from the group consisting of a substituted or unsubstituted cyclic compound having 1 to 20 carbon atoms, aryl, diaryl ether, diaryl sulfide, diaryl sulfoxide and diaryl ketone; and $R_1$ is a hydrogen atom, a substituted or unsubstituted alkyl group having 1 to 10 carbon atoms, or an aryl group having 1 to 14 carbon atoms;

[Formula 2]

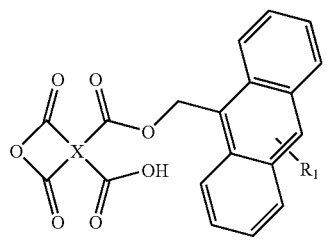

wherein in the formulas (2), X is selected from the group consisting of a substituted or unsubstituted cyclic compound having 1 to 20 carbon atoms, aryl, diaryl ether, diaryl sulfide, diaryl sulfoxide and diaryl ketone; and $R_1$ is a hydrogen atom, a substituted or unsubstituted alkyl group having 1 to 10 carbon atoms, or an aryl group having 1 to 14 carbon atoms.

The light absorbent that is included in the organic anti-reflection coating can be present in the anti-reflection coating such that the light absorbent which is a chemical species capable of absorbing light is contained in a compound, or the light absorbent exists separately from a polymer which is incapable of absorbing light. Typically, the light absorbent is used separately so that the amount of the light-absorbing chemical species can be controlled. The light absorbents of the formula (1a), (1b) and formula (2) used in an embodiment of the present invention are produced by reacting a substituted or unsubstituted anthracene alcohol compound represented by the following formula (3), with various dianhydride compounds in the presence of a base, and then neutralizing the base used in the reaction with an acid:

[Formula 3]

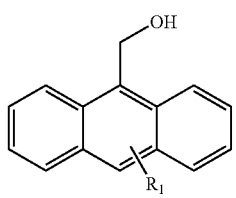

wherein in the formulas (3), $R_1$ is a hydrogen atom, a substituted or unsubstituted alkyl group having 1 to 10 carbon atoms, or an aryl group having 1 to 14 carbon atoms.

Meanwhile, examples of the light absorbents produced by reacting the compound of the formula (3) with dianhydride compounds according to an embodiment of the present invention, include compounds of the following formula (4a) to formula (7) and mixtures thereof:

[Formula 4a]

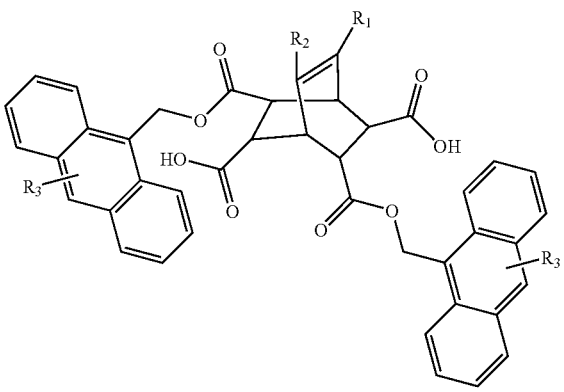

[Formula 4b]

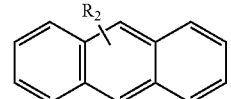

wherein in the formulas (4a) and (4b), $R_1$ and $R_2$, which may be identical or different, each independently represent H, —OH, —OCOCH$_3$, —COOH, —CH$_2$OH, or a substituted or unsubstituted, straight-chained or branched alkyl or alkoxy-alkyl group having 1 to 5 carbon atoms; and $R_3$ is a hydrogen atom, a substituted or unsubstituted alkyl group having 1 to 10 carbon atoms, or an aryl group having 1 to 14 carbon atoms;

[Formula 5a]

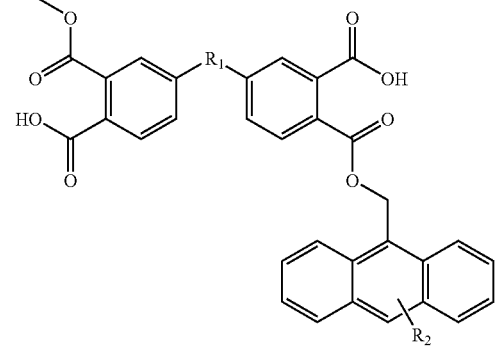

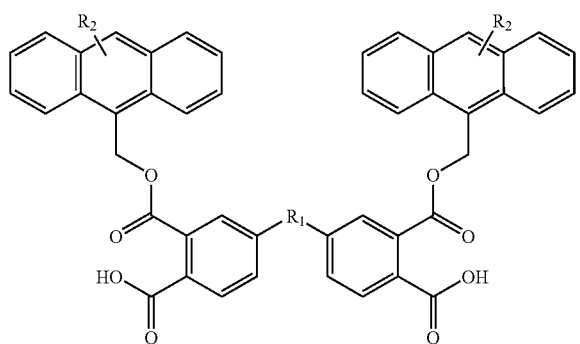

[Formula 5b]

wherein in the formulas (5a) and (5b), $R_1$ represents a ketone group, an oxygen atom, a sulfur atom, or an alkyl group having 1 to 5 carbon atoms; and $R_2$ represents a hydrogen atom, a substituted or unsubstituted alkyl group having 1 to 10 carbon atoms, or an aryl group having 1 to 14 carbon atoms;

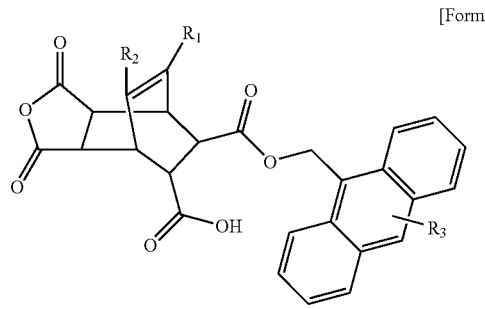

[Formula 6]

wherein in the formulas (6), $R_1$ and $R_2$, which may be identical or different, each independently represent H, —OH, —OCOCH$_3$, —COOH, —CH$_2$OH, or a substituted or unsubstituted, straight-chained or branched alkyl or alkoxyalkyl group having 1 to 5 carbon atoms; and $R_3$ is a hydrogen atom, a substituted or unsubstituted alkyl group having 1 to 10 carbon atoms, or an aryl group having 1 to 14 carbon atoms;

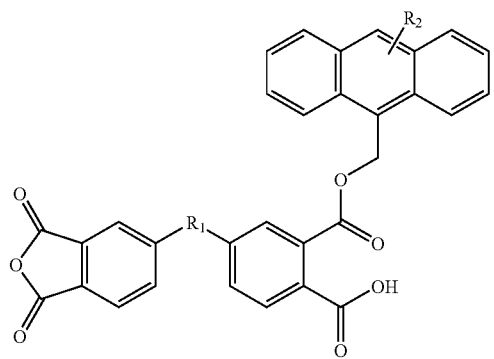

[Formula 7]

wherein in the formulas (7), $R_1$ represents a ketone group, an oxygen atom, a sulfur atom, or an alkyl group having 1 to 5 carbon atoms; and $R_2$ is a hydrogen atom, a substituted or unsubstituted alkyl group having 1 to 10 carbon atoms, or an aryl group having 1 to 14 carbon atoms.

The aforementioned light absorbents comprise anthracene chromophores, and contain functional groups which allow thermal curing.

Specifically, since the anthracene chromophore derivatives may have etching properties that vary widely depending on the structure, in the present invention, those derivatives having various structures have been introduced and applied to the organic anti-reflection coating composition.

With regard to the reaction between the light absorbent and the thermocurable compound which is a polymer to be described later, the carboxylic acid functional group of the light absorbent generated by ring-opening with an alcohol compound, reacts with a functional group of the thermocurable compound, such as acetal, epoxy or hemiacetal, to form a crosslinked structure.

Various dianhydrides are highly reactive with alcohols, and have four reactive functional groups. Thus, the dianhydrides are advantageous in that the compounds can have one or two chromophores introduced therein, and still have crosslinkable sites in the subsequent processes. Such light absorbents can be synthesized by conventional synthesis methods, but the synthesis method employing a base as used in the present invention is most preferred in terms of the reactivity of the compound.

Examples of the base that can be used include dimethylaminopyridine, pyridine, 1,4 diazabicyclo[2,2,2]octane, 1,5-diazabicyclo[4,3,0]nonane, triethylamine, 2,6-di-tert-butylpyridine, diisopropylethylamine, diazabicycloundecene, tetramethylethylenediamine and the like, and there is no particular limitation in the base.

As for the solvent for synthesis, one or more selected from benzene, toluene, xylene, halogenated benzene, diethyl ether, tetrahydrofuran, esters, ethers, lactones, ketones and amides, can be used.

The synthesis temperature of the compounds can be selected in accordance with the solvent and used, and is in the range of 5° C. to 200° C., and preferably 20° C. to 100° C.

Hereinafter, the organic anti-reflection coating composition comprising the light absorbent newly created according to the present invention will be discussed in further detail.

The organic anti-reflection coating composition according to another embodiment includes a light absorbent, a polymer, a thermal acid generating agent, a crosslinking agent and a solvent.

The light absorbent is a light absorbent selected from a compound represented by the formula (1a), a compound represented by the formula (1b), a mixture of compounds represented by the formulas (1a) and (1b), and a compound represented by the formula (2). The polymer included in the organic anti-reflection coating composition of the present invention can be obtained by polymerizing an acrylate-based monomer, a maleic anhydride-based monomer, a phenolic monomer or an ester-based monomer, and is not particularly limited as long as the polymer is a straight-chained or branched polymer containing crosslinkable sites at the main chain terminals or side chain terminals.

The organic anti-reflection coating employing such polymer undergoes curing during a baking process after being applied on a substrate, and attains resistance to dissolution in solvents.

Accordingly, a phenomenon in which the anti-reflection coating is not dissolved in the solvent of photosensitizer during the coating of a photosensitizer after the lamination of the anti-reflection coating, does not occur, and stability can be imparted.

Furthermore, the organic anti-reflection coating composition of the present invention can further include additives so as to accelerate the curing of the light absorbent and the polymer, and to enhance the performance. Examples of such additives include a crosslinking agent and a thermal acid generating agent.

First, the crosslinking agent is preferably a compound having at least two functional groups capable of crosslinking, and examples thereof include aminoplastic compounds, polyfunctional epoxy resins, dianhydride mixtures, and the like.

The aminoplastic compound may be exemplified by dimethoxymethylglycoluril, diethoxymethylglycoluril, diethyldimethylmethylglycoluril, tetramethoxymethylglycoluril, a hexamethoxymethylmelamine resin, mixtures thereof, or the like.

As for the polyfunctional epoxy compound, it is preferable to use, for example, MY720, CY179MA, DENACOL and the like, and products similar thereto.

Next, it is preferable to use a thermal acid generating agent as a catalyst for accelerating the curing reaction. As for the thermal acid generating agent included in the present invention, it is preferable to use compounds selected from the group consisting of an amine salt of toluenesulfonic acid, pyridine salt of toluenesulfonic acid, an amine salt of an alkylsulfonic acid, pyridine salt of an alkylsulfonic acid, and combinations thereof.

As for the organic solvent that can be used in the organic anti-reflection coating composition of the present invention, it is preferable to use one or more solvents selected from the group consisting of propylene glycol monomethyl ether (PGME), propylene glycol monomethyl ether acetate (PGMEA), cyclohexanone, ethyl lactate, propylene glycol n-propyl ether, dimethylformamide (DMF), γ-butyrolactone, ethoxyethanol, methoxyethanol, methyl 3-methoxypropionate (MMP), ethyl 3-ethoxypropionate (EEP) and the like.

The organic anti-reflection coating composition according to another embodiment of the present invention preferably contains the light absorbent represented by formula (1a), (1b) or formula (2) in an amount of 0.1 to 40% by weight, and more preferably 0.1 to 15% by weight, of the whole composition. The polymer is preferably contained in an amount of 0.1 to 20% by weight of the whole composition. The crosslinking agent is preferably contained in an amount of 0.01 to 15% by weight of the whole composition, while the thermal acid generating agent is preferably contained in an amount of 0.01 to 20% by weight, and more preferably 0.01 to 15% by weight, of the whole composition.

Meanwhile, when an organic anti-reflection coating composition including the constituent components as described above at the above-mentioned proportions, is applied on a wafer, and a thermal process such as baking is carried out, acid is generated from the thermal acid generating agent, and in the presence of the generated acid, the crosslinking reaction occurring among the light absorbent represented by the formula (1a), (1b) or formula (2), the polymer and the crosslinking agent used as an additive, is promoted. Thus, an organic anti-reflection coating which is not dissolved in an organic solvent is formed. Such organic anti-reflection coating absorbs the far-ultraviolet rays that have transmitted through photoresist and arrive at the coating, and thus can prevent the diffuse reflection occurring at the photoresist undercoat.

A method for patterning a semiconductor device using the organic anti-reflection coating described above, comprises applying the organic anti-reflection coating composition on top of a layer to be etched; curing the applied composition through a baking process, and forming a crosslinked structure to form an organic anti-reflection coating; applying a photoresist on top of the organic anti-reflection coating, and performing exposure and development successively to pattern the photoresist; and etching the organic anti-reflection coating using the photoresist pattern as an etching mask, and then etching the layer to be etched so as to pattern the layer to be etched.

In the lamination process for the organic anti-reflection coating according to the present invention, the baking process is preferably carried out at a temperature of 150 to 250° C. for 0.5 to 5 minutes.

Furthermore, in the patterning method according to the present invention, a baking process can be additionally carried out once after applying a hardmask, and then before or after laminating an organic or inorganic composition for anti-reflection coating or silicone anti-reflection coating on top of the spin-on carbon hardmask thus formed. Such baking process is preferably carried out at a temperature of 70 to 200° C.

EFFECTS OF THE INVENTION

As discussed in the above, the organic anti-reflection coating composition according to the present invention has excellent adhesiveness and storage stability, and exhibits excellent resolution in both C/H patterns and L/S patterns. Also, the patterning method of the invention has an excellent process window, and thus excellent pattern profiles can be obtained irrespective of the type of substrate.

When patterning is performed using the organic anti-reflection coating composition, the anti-reflection coating can be rapidly etched in an ultrafine patterning process using a light source at 248 nm, and thus contributions can be made to encourage more active development of highly integrated semiconductor devices.

EXAMPLES

Hereinafter, the present invention will be described more specifically with reference to preferred Examples and Comparative Examples. However, it should be noted that the present invention is not intended to be limited to these Examples.

Synthesis Example 1

Synthesis of Light Absorbent for Organic Anti-Reflection Coating 70 g of bicyclo[2,2,2]octene[2,3,5,6]tetracarboxylic acid dianhydride, 147 g of anthracenemethanol, 46 g of pyridine, and 0.6 g of dimethylaminopyridine are dissolved in 540 g of 1,4-dioxane, and then the mixture is allowed to react at 50° C. for 24 hours. After completion of the reaction, formic acid is added dropwise to the reaction solution to neutralize the reaction solution. A precipitate obtained by adding this reaction product into water, is filtered, then washed several times with distilled water, and then dried to obtain 172.8 g (yield=80%) of the desired compound. The $^1$H-NMR spectrum of the copolymer produced according to the Synthesis Example 1 is shown in FIG. 1.

Synthesis Example 2

Synthesis of Light Absorbent for Organic Anti-Reflection Coating 70 g of bicyclo[2,2,2]octene[2,3,5,6]tetracarboxylic acid dianhydride, 147 g of anthracenemethanol, 46 g of pyridine, and 0.6 g of dimethylaminopyridine are dissolved in 540 g of 1,4-dioxane, and then the mixture is allowed to react at 50° C. for 24 hours. After completion of the reaction, formic acid is added dropwise to the reaction solution to neutralize the reaction solution. This reaction product is diluted with ethyl acetate, and extracted with water, and then the ethyl acetate layer is vacuum dried to obtain 170.64 g (yield=79%) of the desired compound.

Synthesis Example 3

Synthesis of Light Absorbent for Organic Anti-Reflection Coating 70 g of bicyclo[2,2,2]octene[2,3,5,6]tetracarboxylic acid dianhydride, 147 g of anthracenemethanol, 57 g of triethylamine, and 0.6 g of dimethylaminopyridine are dissolved in 540 g of 1,4-dioxane, and then the mixture is allowed to react at 50° C. for 24 hours. After completion of the reaction, formic acid is added dropwise to the reaction solution to neutralize the reaction solution. A precipitate obtained by adding this reaction product into water, is filtered, then washed several times with distilled water, and then dried to obtain 172.8 g (yield=80%) of the desired compound.

Synthesis Example 4

Synthesis of Light Absorbent for Organic Anti-Reflection Coating 70 g of bicyclo[2,2,2]octene[2,3,5,6]tetracarboxylic acid dianhydride, 147 g of anthracenemethanol, and 7.3 g of diisopropylethylamine are dissolved in 540 g of 1,4-dioxane, and then the mixture is allowed to react at 50° C. for 16 hours. After completion of the reaction, formic acid is added dropwise to the reaction solution to neutralize the reaction solution. A precipitate obtained by adding this reaction product into water, is filtered, then washed several times with distilled water, and then dried to obtain 172.8 g (yield=80%) of the desired compound.

Synthesis Example 5

Synthesis of Light Absorbent for Organic Anti-Reflection Coating 109 g of benzophenonetetracarboxylic acid dianhydride, 140 g of anthracenemethanol, and 7.3 g of diisopropylethylamine are dissolved in 540 g of 1,4-dioxane, and then the mixture is allowed to react at 50° C. for 16 hours. After completion of the reaction, formic acid is added dropwise to the reaction solution to neutralize the reaction solution. A precipitate obtained by adding this reaction product into water, is filtered, then washed several times with distilled water, and then dried to obtain 172.8 g (yield=70%) of the desired compound.

Synthesis Example 6

Figure 2:
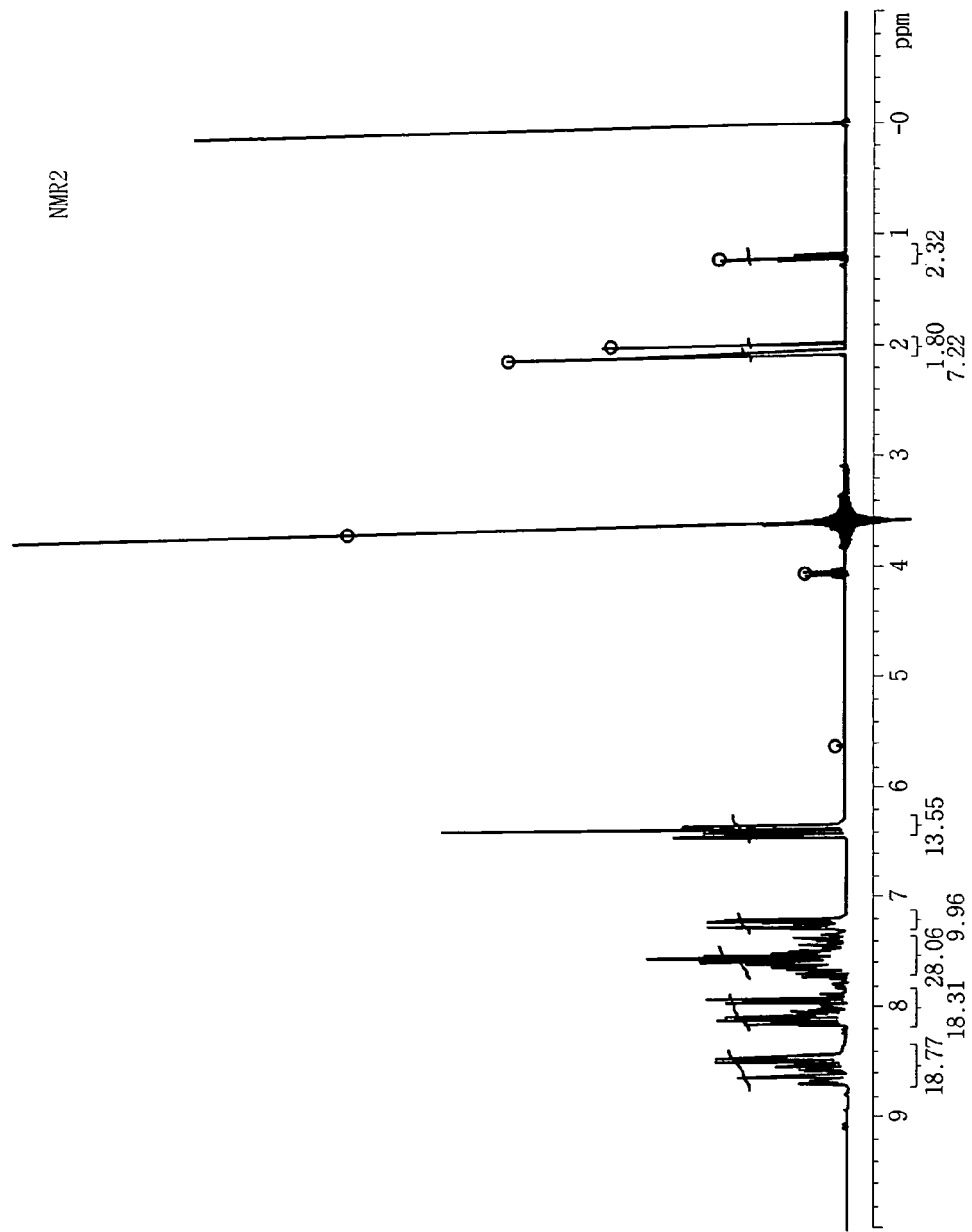
FIG. 2 is a $^1$H-NMR spectrum of the copolymer produced according to Synthesis Example 6.
Figure 3:
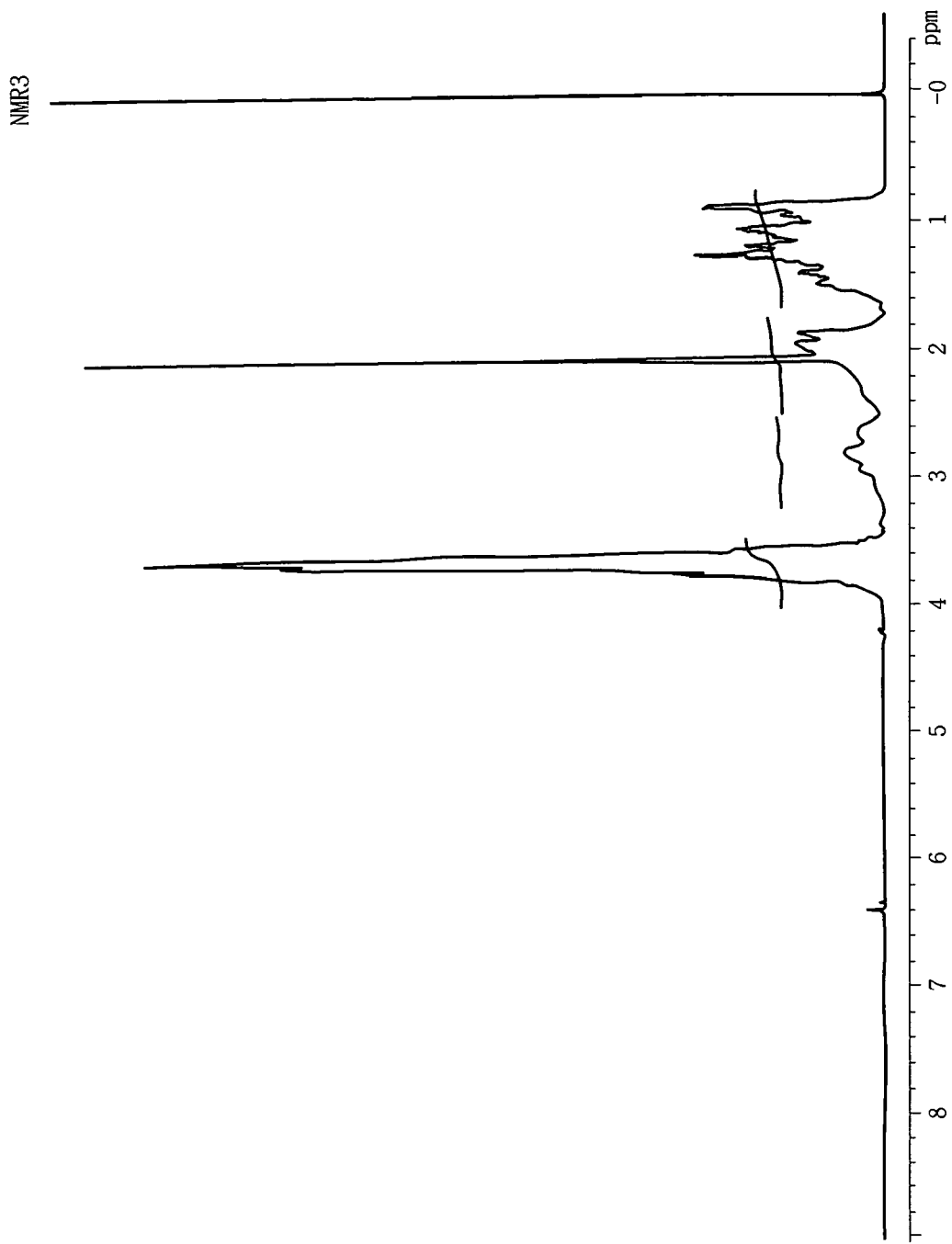
FIG. 3 is a $^1$H-NMR spectrum of the copolymer produced according to Synthesis Example 7.

Synthesis of Light Absorbent for Organic Anti-Reflection Coating 75 g of 4,4'-oxydiphthalic anhydride, 100 g of anthracenemethanol, and 7.3 g of diisopropylethylamine are dissolved in 540 g of 1,4-dioxane, and then the mixture is allowed to react at 50° C. for 16 hours. After completion of the reaction, formic acid is added dropwise to the reaction solution to neutralize the reaction solution. A precipitate obtained by adding this reaction product into water, is filtered, then washed several times with distilled water, and then dried to obtain 172.8 g (yield=95%) of the desired compound. The 1H-NMR spectrum of the copolymer produced according to Synthesis Example 6 is shown in FIG. 2.

Synthesis Example 7

Synthesis of Light Absorbent for Organic Anti-Reflection Coating 75 g of 4,4'-oxydiphthalic anhydride, 100 g of 1,2,10-anthracenetriol, and 7.3 g of diisopropylethylamine are dissolved in 540 g of 1,4-dioxane, and then the mixture is allowed to react at 50° C. for 16 hours. After completion of the reaction, formic acid is added dropwise to the reaction solution to neutralize the reaction solution. A precipitate obtained by adding this reaction product into water, is filtered, then washed several times with distilled water, and then dried to obtain 86.4 g (yield=48%) of the desired compound.

Synthesis Example 8

Synthesis of Light Absorbent for Organic Anti-Reflection Coating 75 g of 4,4'-oxydiphthalic anhydride, 50 g of anthracenemethanol, and 3.65 g of diisopropylethylamine are dissolved in 300 g of 1,4-dioxane, and then the mixture is allowed to react at 50° C. for 16 hours. After completion of the reaction, formic acid is added dropwise to the reaction solution to neutralize the reaction solution. A precipitate obtained by adding this reaction product into water, is filtered, then washed several times with distilled water, and then dried to obtain 63 g (yield=50.4%) of the desired compound.

Synthesis Example 9

Synthesis of Light Absorbent for Organic Anti-Reflection Coating 29.4 g of maleic anhydride, 30 g of methyl methacrylate, and 2.97 g of AIBN are dissolved in 120 g of 1,4-dioxane, and then the mixture is allowed to undergo polymerization at 70° C. for 12 hours. After completion of the reaction, a precipitate obtained by adding the reaction solution into methyl alcohol, is filtered, then washed several times with methyl alcohol, and vacuum dried (Mw=47,100, PDI=2.17, yield=58%). 72 g of the vacuum dried polymer and 0.55 g of toluenesulfonic acid monohydrate are mixed with 725 g of methyl alcohol, and then, the mixture is allowed to react at 70° C. for 48 hours. After completion of the reaction, a precipitate obtained by adding the reaction solution into distilled water, is filtered, then washed several times with distilled water, and vacuum dried (yield=58%).

Example 1

Production of Organic Anti-Reflection Coating Composition A 7 g of the light absorbent for organic anti-reflection coating produced in the Synthesis Example 1, 6 g of the polymer produced in the Synthesis Example 9, 9 g of tetramethoxymethylglycoluril, and 1 g of pyridinium p-toluenesulfonate are dissolved in 966 g of propylene glycol monomethyl ether acetate, and then filtered through a membrane filter having a pore size of 0.2 μm, to thus produce the organic anti-reflection coating composition A.

Example 2

Production of Organic Anti-Reflection Coating Composition B 7 g of the light absorbent for organic anti-reflection coating produced in the Synthesis Example 5, 17 g of the polymer produced in the Synthesis Example 9, 8 g of tetramethoxymethylglycoluril, and 3 g of a thermal acid generating agent having the structure of formula 8 are dissolved in 964 g of ethyl lactate, and then filtered through a membrane filter having a pore size of 0.2 μm, to thus produce the organic anti-reflection coating composition B.

Example 3

Production of Organic Anti-Reflection Coating Composition C 8 g of the light absorbent for organic anti-reflection coating produced in the Synthesis Example 6, 10 g of the polymer produced in the Synthesis Example 9, 9 g of tetramethoxymethylglycoluril, and 4 g of pyridinium p-toluenesulfonate are dissolved in 970 g of propylene glycol monomethyl ether acetate, and then filtered through a membrane filter having a pore size of 0.2 μm, to thus produce the organic anti-reflection coating composition C.

Example 4

Production of Organic Anti-Reflection Coating Composition D 7 g of the light absorbent for organic anti-reflection coating produced in the Synthesis Example 1, 6 g of the polymer produced in the Synthesis Example 9, 9 g of diethoxy-dimethoxyglycoluril, and 1 g of pyridinium p-toluenesulfonate are dissolved in 966 g of propylene glycol monomethyl ether acetate, and then filtered through a membrane filter having a pore size of 0.2 μm, to thus produce the organic anti-reflection coating composition D.

Example 5

Production of Organic Anti-Reflection Coating Composition E 8 g of the light absorbent for organic anti-reflection coating produced in the Synthesis Example 7, 10 g of the polymer produced in the Synthesis Example 9, 9 g of tetramethoxymethylglycoluril, and 4 g of pyridinium p-toluenesulfonate are dissolved in 970 g of propylene glycol monomethyl ether acetate, and then filtered through a membrane filter having a pore size of 0.2 μm, to thus produce the organic anti-reflection coating composition E.

Example 6

Production of Organic Anti-Reflection Coating Composition F 8 g of the light absorbent for organic anti-reflection coating produced in the Synthesis Example 8, 10 g of the polymer produced in the Synthesis Example 9, 9 g of tetramethoxymethylglycoluril, and 4 g of pyridinium p-toluenesulfonate are dissolved in 970 g of propylene glycol monomethyl ether acetate, and then filtered through a membrane filter having a pore size of 0.2 μm, to thus produce the organic anti-reflection coating composition A.

Measurement of properties of organic anti-reflection coating and results of photoresist patterning 1) Stripping Test Each of the organic anti-reflection coating compositions A, B, C, D, E and F produced in Example 1 to Example 6 was spin coated on a silicon wafer, and then baked for 1 minute on a plate heated to 230° C., to form an organic anti-reflection coating. The thickness of each of the organic anti-reflection coatings laminated on the wafer was measured, and the wafer laminated with the organic anti-reflection coating was immersed in ethyl lactate for 1 minute. Then, ethyl lactate was completely removed, and the wafer with the anti-reflection coating was baked for 1 minute on a plate heated to 100° C. Then, the thickness of the organic anti-reflection coating was measured again. As a result of the measurement, there was not observed any changes in the thickness of the coating before the ethyl lactate treatment and of the coating after the ethyl lactate treatment. That is, it could be confirmed that the organic anti-reflection coating composition is completely cured during the baking process, and thus intermixing with photoresist or the like does not occur during the process of lithography.

2) Measurement of Refractive Index (n) and Extinction Coefficient

Each of the organic anti-reflection coating compositions A, B, C, D, E and F produced in Example 1 to Example 6 was spin coated on a silicon wafer, and then baked for 1 minute on a plate heated to 230° C., to form a crosslinked organic anti-reflection coating. These organic anti-reflection coatings were respectively subjected to measurement of the refractive index (n) and the extinction coefficient (k) at 248 nm using a spectroscopic ellipsometer. As a result of measurement, the refractive index (n) of the organic anti-reflection coating composition A was 1.457, and the extinction coefficient (k) thereof was 0.43. The refractive index (n) of the organic anti-reflection coating composition B was 1.456, and the extinction coefficient (k) thereof was 0.420. The refractive index (n) of the organic anti-reflection coating composition C was 1.457, and the extinction coefficient (k) thereof was 0.425. The refractive index (n) of the organic anti-reflection coating composition D was 1.455, and the extinction coefficient (k) thereof was 0.418. The refractive index (n) of the organic anti-reflection coating composition E was 1.542, and the extinction coefficient (k) thereof was 0.423. The refractive index (n) of the organic anti-reflection coating composition F was 1.545, and the extinction coefficient (k) thereof was 0.420.

3) Patterning of Organic Anti-Reflection Coating and Photoresist

Each of the organic anti-reflection coating compositions A, B, C, D, E and F produced in Example 1 to Example 6 was spin coated on a silicon wafer, and then baked for 1 minute on a plate heated to 230° C., to form an organic anti-reflection coating. Subsequently, KrF photoresist was applied on top of the anti-reflection coating, and then the coated wafer was baked at 110° C. for 90 seconds. After the baking, exposure was performed using a scanner apparatus, and then the coated wafer was baked again at 110° C. for 90 seconds. The exposed wafer was developed using a developer solution containing 2.38% by weight of TMAH, and thus the final photoresist pattern could be obtained. A C/H (Contact Hole) pattern having a size of 150 μm was obtained.

The photoresist pattern using the organic anti-reflection coating composition A was a good vertical pattern, and had an energy margin of about 18% and a focus depth margin of about 0.5 µm. The photoresist pattern using the organic anti-reflection coating composition B was a good vertical pattern, and had an energy margin of about 17% and a focus depth margin of about 0.45 µm. The photoresist pattern using the organic anti-reflection coating composition C was a good vertical pattern, and had an energy margin of about 17% and a focus depth margin of about 0.5 µm. The photoresist pattern using the organic anti-reflection coating composition D was a good vertical pattern, and had an energy margin of about 19% and a focus depth margin of about 0.5 µm. The photoresist pattern using the organic anti-reflection coating composition E was a good vertical pattern, and had an energy margin of about 17% and a focus depth margin of about 0.4 µm. The photoresist pattern using the organic anti-reflection coating composition F was a good vertical pattern, and had an energy margin of about 16% and a focus depth margin of about 0.4 µm.

Therefore, from the results as described above, it can be seen that an anti-reflection coating obtained from the organic anti-reflection coating composition of the present invention provides sufficiently broad energy margins and focus depth margins. Also, the anti-reflection coating composition provides excellent vertical patterns where undercut or footing is not observed.

What is claimed is:

1. A light absorbent for organic anti-reflection coating formation, comprising a compound of the following formula (1a), a compound of the following formula (1b), or a mixture of compounds of formulas (1a) and (1b):

[Formula 1a]

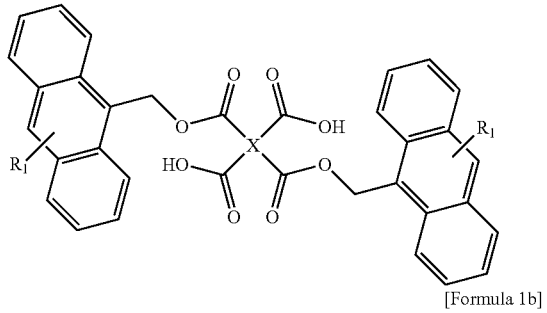

[Formula 1b]

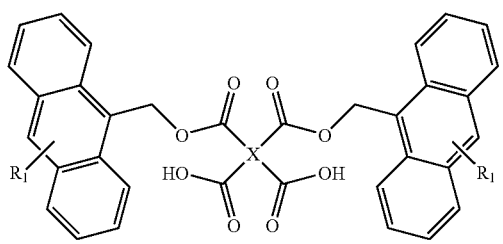

wherein in the formulas (1a) and (1b), X is selected from the group consisting of a substituted or unsubstituted cyclic group having 1 to 20 carbon atoms, an aryl group, diaryl ether, diaryl sulfide, diaryl sulfoxide and diaryl ketone; and $R_1$ is a hydrogen atom, a substituted or unsubstituted alkyl group having 1 to 10 carbon atoms, or an aryl group having 1 to 14 carbon atoms.

2. The light absorbent for organic anti-reflection coating formation according to claim 1, wherein the compound of the formula (1a) and the compound of the formula (1b) were produced by performing a reaction in an basic environment.

3. The light absorbent for organic anti-reflection coating formation according to claim 2, wherein the base is a compound selected from the group consisting of dimethylaminopyridine, pyridine, 1,4-diazabicyclo[2,2,2]octane, 1,5-diazabicyclo[4,3,0]nonane, triethylamine, 2,6-di-tert-butylpyridine, diisopropylethylamine, diazabicycloundecene and tetramethylethylenediamine.

4. An organic anti-reflection coating composition comprising the light absorbent according to claim 1, a polymer, a thermal acid generating agent, a crosslinking agent and a solvent.

5. The organic anti-reflection coating composition according to claim 4, wherein the composition includes 0.1 to 40% by weight of the light absorbent, 0.1 to 20% by weight of the polymer, 0.01 to 20% by weight of the thermal acid generating agent, and 0.01 to 15% by weight of the crosslinking agent.

6. The organic anti-reflection coating composition according to claim 4, wherein the polymer is a resin having crosslinkable sites at the main chain ends and the side chain ends.

7. The organic anti-reflection coating composition according to claim 4, wherein the crosslinking agent is an aminoplastic compound, a polyfunctional epoxy resin, diannhydride or a mixture thereof.

8. The organic anti-reflection coating composition according to claim 4, wherein the thermal acid generating agent is selected from the group consisting of an amine salt of toluenesulfonic acid, a pyridine salt of toluenesulfonic acid, an amine salt of an alkylsulfonic acid, a pyridine salt of an alkylsulfonic acid and combinations thereof.

9. The organic anti-reflection coating composition according to claim 4, wherein the solvent is one or more selected from the group consisting of propylene glycol monomethyl ether (PGME), propylene glycol monomethyl ether acetate (PGMEA), cyclohexanone, ethyl lactate, propylene glycol n-propyl ether, dimethylformamide (DMF), γ-butyrolactone, ethoxyethanol, methoxyethanol, methyl 3-methoxypropionate (MMP) and ethyl 3-ethoxypropionate (EEP).

* * * * *